United States Patent
Gao

(10) Patent No.: US 9,158,166 B2
(45) Date of Patent: Oct. 13, 2015

(54) SHORTING STRIP STRUCTURE OF LIQUID CRYSTAL DISPLAY PANEL AND LIQUID CRYSTAL DISPLAY PANEL

(71) Applicant: Shenzhen China Star Optoelectronics Technology Co., Ltd., Shenzhen, Guangdong (CN)

(72) Inventor: Dongzi Gao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/003,022

(22) PCT Filed: Jun. 28, 2013

(86) PCT No.: PCT/CN2013/078245
§ 371 (c)(1),
(2) Date: Sep. 4, 2013

(87) PCT Pub. No.: WO2014/180051
PCT Pub. Date: Nov. 13, 2014

(65) Prior Publication Data
US 2014/0333861 A1    Nov. 13, 2014

(30) Foreign Application Priority Data
May 8, 2013 (CN) .......................... 2013 1 0166665

(51) Int. Cl.
*G02F 1/1333* (2006.01)
*G02F 1/1362* (2006.01)
*H01L 27/02* (2006.01)

(52) U.S. Cl.
CPC ...... *G02F 1/136204* (2013.01); *H01L 27/0288* (2013.01); *H01L 27/0292* (2013.01)

(58) Field of Classification Search
CPC .......... G02F 1/136204; G02F 2202/22; G02F 2001/133334; G02F 2001/136254; G02F 1/1309; G02F 1/136259; H01L 27/0292; H01L 27/0288
USPC ............................................................ 349/40
See application file for complete search history.

(56) References Cited

U.S. PATENT DOCUMENTS

| 6,654,074 B1 | 11/2003 | Ha et al. | |
| 2002/0089614 A1* | 7/2002 | Kim | ................................ 349/40 |

(Continued)

FOREIGN PATENT DOCUMENTS

| CN | 102981340 A | 3/2013 |
| KR | 20020010198A A | 2/2002 |

*Primary Examiner* — Bumsuk Won
*Assistant Examiner* — Charles Chang
(74) *Attorney, Agent, or Firm* — Andrew C. Cheng

(57) ABSTRACT

The present invention provides a shorting strip structure of a liquid crystal display panel and a liquid crystal display panel. The shorting strip structure includes: an even-numbered gate line and an odd-numbered gate line that are arranged parallel, a plurality of even-numbered data lines and a plurality of odd-numbered data lines that are arranged parallel, and a shorting strip that is arranged parallel to the even-numbered gate line. The even-numbered data lines are perpendicularly connected to the even-numbered gate line. The odd-numbered data lines are perpendicularly connected to the odd-numbered gate line. The shorting strip is electrically connected to ends of the plurality of even-numbered data lines that are adjacent to the even-numbered gate line. The present invention is arranged to have the shorting strip connecting the ends of the even-numbered data lines that are adjacent to the even-numbered gate line to each other to effectively spread out electrical charges and to prevent an issue of circuit burn-out caused by an excessive current that is induced at the time when the electrical charges are eventually discharged due to accumulation, so as to effectively enhance the yield rate of the liquid crystal display panel. Further, the shorting strip and the even-numbered data lines are formed simultaneously so that the manufacture process is simple and the cost is low so as to be favorable for cost control.

9 Claims, 5 Drawing Sheets

(56) References Cited

U.S. PATENT DOCUMENTS

| | | |
|---|---|---|
| 2003/0117536 A1 * | 6/2003 | Jeon ................................ 349/40 |
| 2003/0197814 A1 | 10/2003 | Choi |
| 2005/0094045 A1 | 5/2005 | Chae |
| 2009/0039348 A1 * | 2/2009 | Lee et al. ........................ 257/48 |
| 2012/0326148 A1 | 12/2012 | Ko et al. |

* cited by examiner

SHORTING STRIP STRUCTURE OF LIQUID CRYSTAL DISPLAY PANEL AND LIQUID CRYSTAL DISPLAY PANEL

BACKGROUND OF THE INVENTION

1. Field of the Invention

The present invention relates to the field of liquid crystal displaying, and in particular to a shorting strip structure of a liquid crystal display panel and a liquid crystal display panel.

2. The Related Arts

Liquid crystal displays have a variety of advantages, such as thin device body, low power consumption, and being free of radiation, and are thus widely used. Most of the liquid crystal displays that are currently available in the market are backlighting liquid crystal displays, which comprise an enclosure, a liquid crystal display panel arranged in the enclosure, and a backlight module that is arranged in the enclosure. The operation principle of the liquid crystal display panel is that, with liquid crystal molecules interposed between two parallel glass substrates, a drive voltage is selectively applied the two glass substrates to control the rotation of the liquid crystal molecules in order to refract out light emitting from the backlight module for generating images.

A liquid crystal display panel generally comprises: a thin-film transistor (TFT) substrate and a color filter (CF) substrate opposite to and bonded to the TFT substrate and a layer of liquid crystal interposed between the TFT substrate and the CF substrate. Referring to FIG. 1, in the known art of manufacturing of TFT substrate, an even-numbered gate line (M1—even) 100 of a gate metal layer (M1) is arranged to short the even-numbered data lines (M2—even) 500 of a source/drain metal layer (M2) through a transparent conductive layer 300. The transparent conductive layer 300 is generally an indium tin oxides (ITO) layer that is used to make a pixel electrode of a thin-film transistor. An odd-numbered gate line (M1—odd) 700 of the gate metal layer is arranged to short the odd-numbered data lines (M2—odd) 900 of the source/drain metal layer through the transparent conductive layer 300. In this arrangement, the even-numbered data lines 500 or the odd-numbered data lines 900 of the source/drain metal layer are shorted together by means of the transparent conductive layer 300; however, the transparent conductive layer 300 is often set at the fifth layer so that before that, all the lines of the even-numbered data lines 500 and the odd-numbered data lines 900 of the source/drain metal layer are independent of each other and this readily lead to accumulation of electrical charges 500, causing electro-static discharge (ESD) occurring at a weak link, especially ESD being easily generated at the sites where the even-numbered data lines 500 and the odd-numbered data lines 900 of the source/drain metal layer are respectively connected to the even-numbered gate line 100 and the odd-numbered gate line 700 of the metal layer. The peak value of an ESD may get as high as tens amperes and may have an extremely large instantaneous power, so that the energy of the electromagnetic pulses generated by ESD may be large enough to burn out the even-numbered gate line 100 and the odd-number gate line 700, leading to incapability of applying a test signal to the TFT substrate in the subsequent array test process and thus affecting the inspection and maintenance of electrical defects and reducing the yield rate of the TFT substrate.

In light of the above described shortcomings, as shown in FIG. 2, a TFT substrate is proposed for the liquid crystal displays, in which gate lines 131, odd-numbered data lines 172, even-numbered data lines 173, a transparent conductive strip 121, and a gate shorting strip 130 are formed on a transparent substrate 11. The transparent conductive strip 121 is disposed under the gate shorting strip 130. The gate lines 131 are in electrical connection with the transparent conductive strip 121, whereby through electrical charges being transferred by way of the transparent conductive strip 121, balance of electrical charge can be achieved to prevent the occurrence of gate shorting strip 130 and the gate lines 131 being burnt out by ESD thereby enhancing the yield rate of the TFT substrates of liquid crystal displays.

However, disposing the transparent conductive strip 121 under the gate shorting strip 130 would increase the steps of the manufacturing process of the TFT substrate thereby increasing the manufacture cost and becoming disadvantageous for cost control.

SUMMARY OF THE INVENTION

An object of the present invention is to provide a shorting strip structure of a liquid crystal display panel, which uses the shorting strip to spread out electrical charges so as to prevent accumulation of electrical charges in the circuit and effectively reduce damage caused by electro-static discharge thereby enhancing the quality of the liquid crystal display panel.

Another object of the present invention is to provide a liquid crystal display panel, which has a simple manufacture process, a low cost, and a high yield rate.

To achieve the objects, the present invention provides a shorting strip structure of a liquid crystal display panel, which comprises: an even-numbered gate line and an odd-numbered gate line that are arranged parallel, a plurality of even-numbered data lines and a plurality of odd-numbered data lines that are arranged parallel, and a shorting strip that is arranged parallel to the even-numbered gate line. The even-numbered data lines are perpendicularly connected to the even-numbered gate line. The odd-numbered data lines are perpendicularly connected to the odd-numbered gate line. The shorting strip being electrically connected to ends of the plurality of even-numbered data lines that are adjacent to the even-numbered gate line.

The even-numbered data lines are perpendicularly connected, via a transparent conductive layer, to the even-numbered gate line and the odd-numbered data lines are perpendicularly connected to, via a transparent conductive layer, to the odd-numbered gate line.

The transparent conductive layer is made of indium tin oxides.

The shorting strip is formed on the same layer as the plurality of even-numbered data lines.

The plurality of even-numbered data lines and the shorting strip are formed integrally.

The present invention also provides a shorting strip structure of a liquid crystal display panel, which comprises: an even-numbered gate line and an odd-numbered gate line that are arranged parallel, a plurality of even-numbered data lines and a plurality of odd-numbered data lines that are arranged parallel, and a shorting strip that is arranged parallel to the even-numbered gate line, the even-numbered data lines being perpendicularly connected to the even-numbered gate line, the odd-numbered data lines being perpendicularly connected to the odd-numbered gate line, the shorting strip being electrically connected to ends of the plurality of even-numbered data lines that are adjacent to the even-numbered gate line;

wherein the even-numbered data lines are perpendicularly connected, via a transparent conductive layer, to the even-numbered gate line and the odd-numbered data lines are perpendicularly connected to, via a transparent conductive layer, to the odd-numbered gate line;

wherein the transparent conductive layer is made of indium tin oxides;

wherein the shorting strip is formed on the same layer as the plurality of even-numbered data lines; and wherein the plurality of even-numbered data lines and the shorting strip are formed integrally.

The present invention further provides a liquid crystal display panel, which comprises: a thin-film transistor substrate, a color filter substrate bonded to the thin-film transistor substrate, and a liquid crystal layer arranged between the thin-film transistor substrate and the color filter substrate. The thin-film transistor substrate comprises a transparent substrate, an even-numbered gate line and an odd-numbered gate line formed on the transparent substrate, a plurality of even-numbered data lines and a plurality of odd-numbered data lines formed on the transparent substrate, and a shorting strip formed on the transparent substrate. The even-numbered gate line, the odd-numbered gate line, and the shorting strip are arranged parallel. The plurality of even-numbered data lines and the plurality of odd-numbered data lines are arranged parallel. The even-numbered data lines are perpendicularly connected to the even-numbered gate line. The odd-numbered data lines are perpendicularly connected to the odd-numbered gate line. The shorting strip is electrically connected to ends of the plurality of even-numbered data lines that are adjacent to the even-numbered gate line.

The even-numbered data lines are perpendicularly connected, via a transparent conductive layer, to the even-numbered gate line and the odd-numbered data lines are perpendicularly connected to, via a transparent conductive layer, to the odd-numbered gate line.

The transparent conductive layer is made of indium tin oxides.

The shorting strip is formed on the same layer as the plurality of even-numbered data lines.

The plurality of even-numbered data lines and the shorting strip are formed integrally.

The efficacy of the present invention is that the present invention provides a shorting strip structure of a liquid crystal display panel and a liquid crystal display panel, in which the shorting strip connects ends of even-numbered data lines that are adjacent to an even-numbered gate line to each other to effectively spread out electrical charges and to prevent an issue of circuit burn-out caused by an excessive current that is induced at the time when the electrical charges are eventually discharged due to accumulation, so as to effectively enhance the yield rate of the liquid crystal display panel. Further, the shorting strip and the even-numbered data lines are formed simultaneously so that the manufacture process is simple and the cost is low so as to be favorable for cost control.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
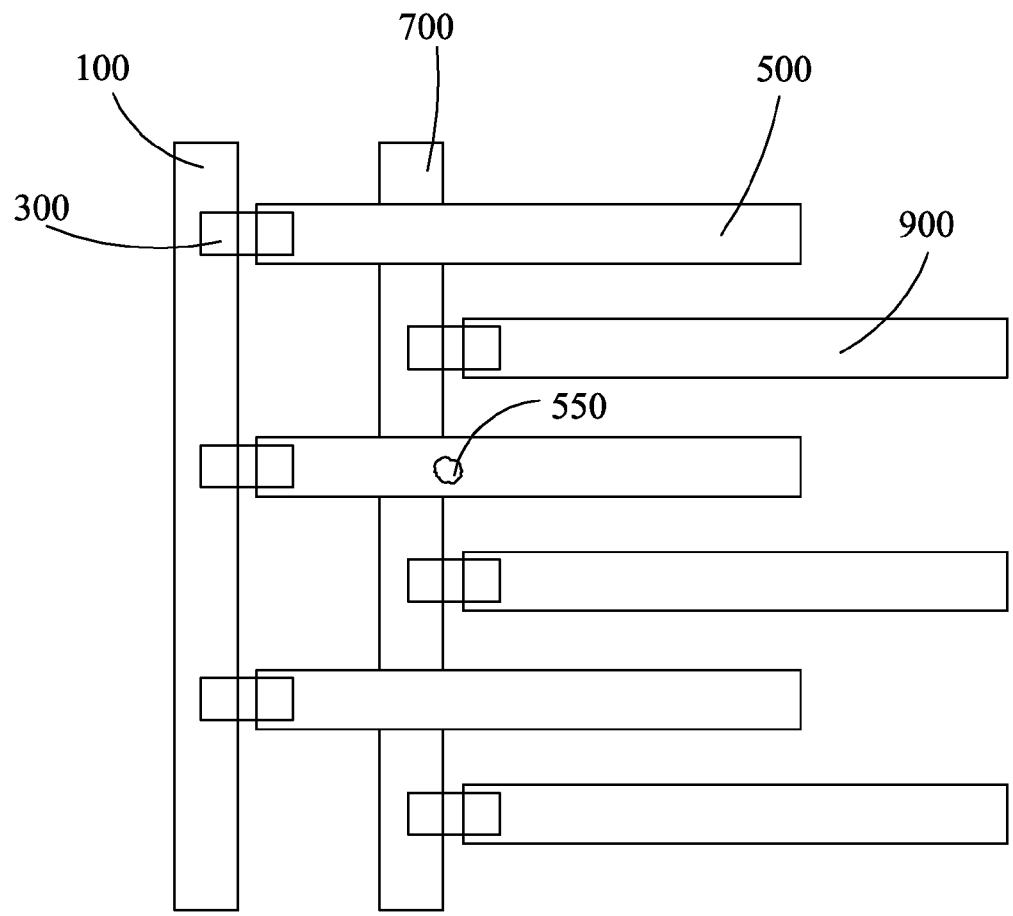
FIG. 1 is a schematic view showing a shorting strip structure of a conventional liquid crystal display panel.
Figure 2:
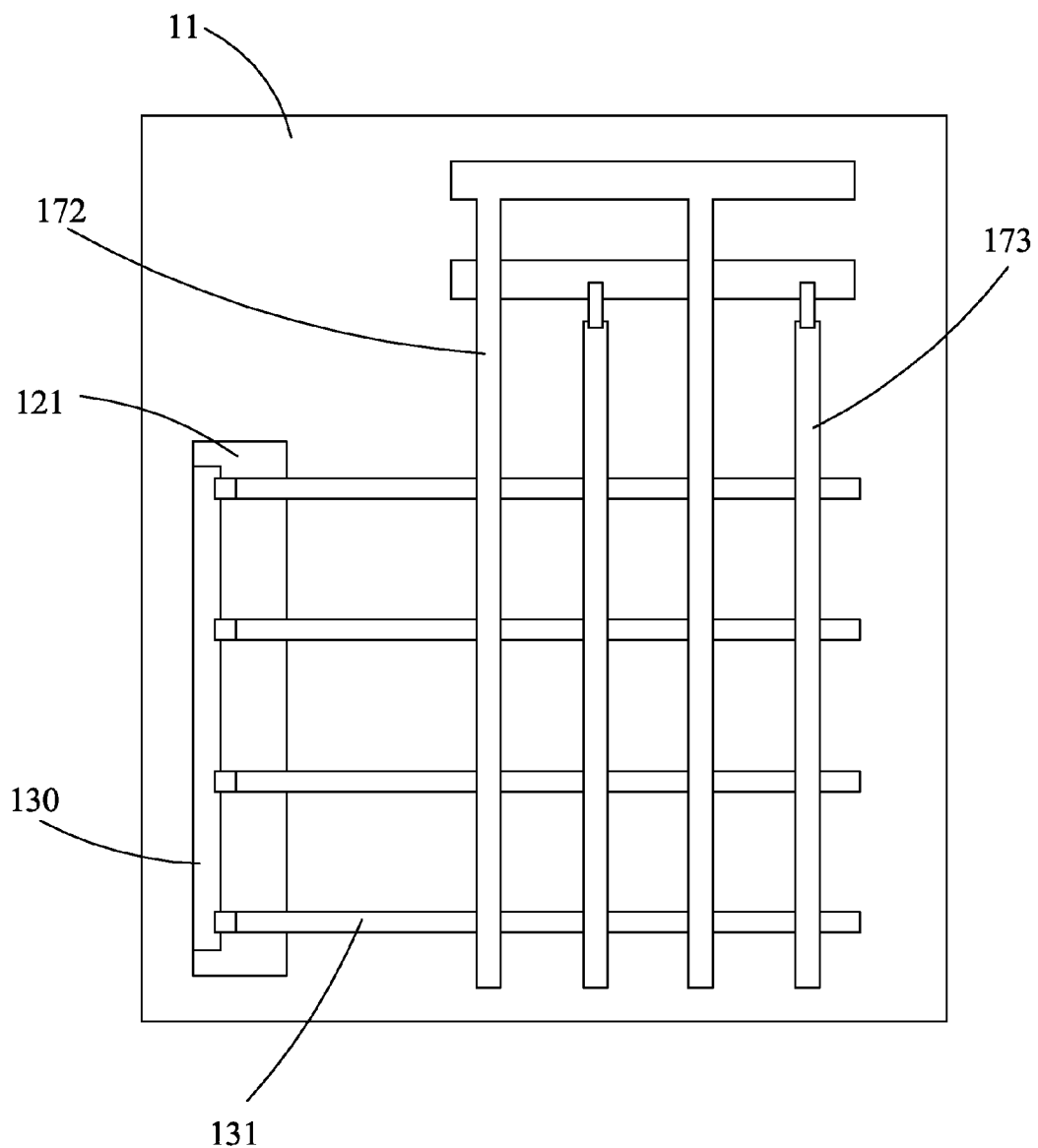
FIG. 2 is a schematic plan view showing a conventional thin-film transistor substrate.
Figure 3:
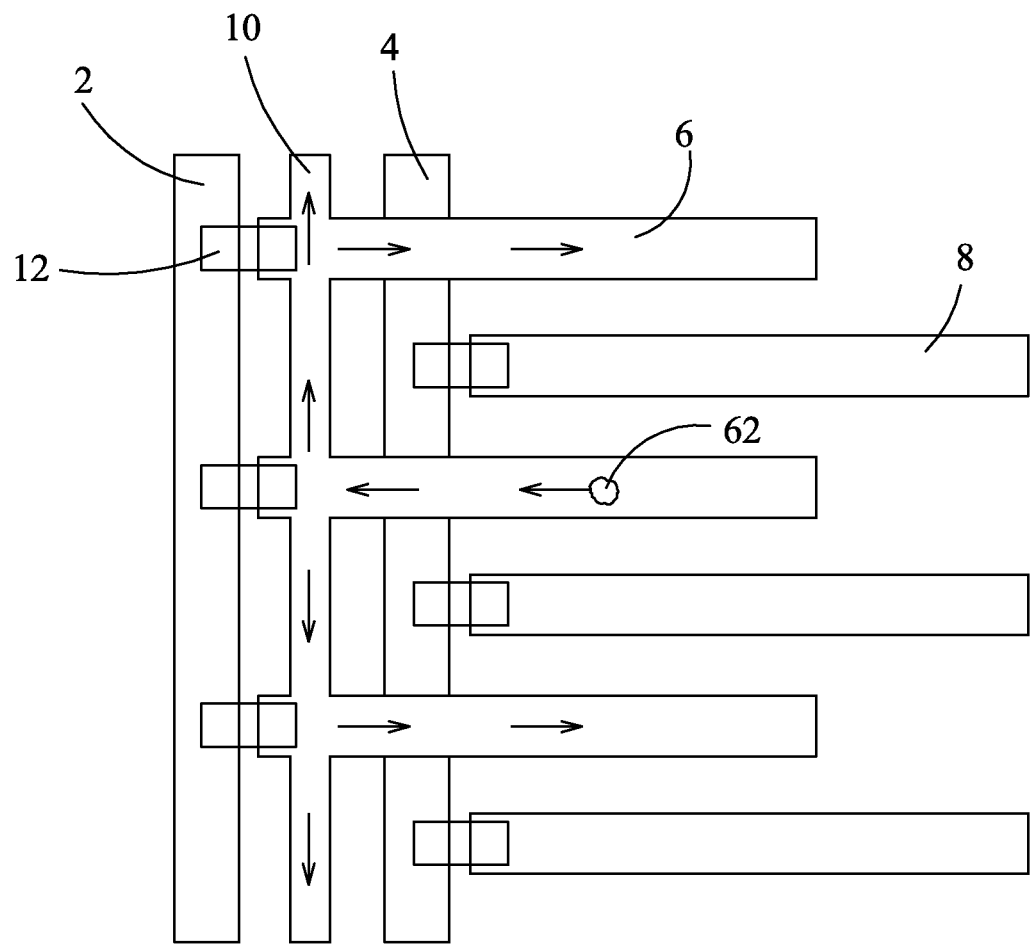
FIG. 3 is a schematic view showing a shorting strip structure of a liquid crystal display panel according to the present invention.

Referring to FIG. 3, the present invention provides a shorting strip structure of a liquid crystal display panel, which comprises: an even-numbered gate line 2 and an odd-numbered gate line 4 that are arranged parallel, a plurality of even-numbered data lines 6 and a plurality of odd-numbered data lines 8 that are arranged parallel, and a shorting strip 10 that is arranged parallel to the even-numbered gate line 2. The even-numbered data lines 6 are perpendicularly connected to the even-numbered gate line 2. The odd-numbered data lines 8 are perpendicularly connected to the odd-numbered gate line 4. The shorting strip 10 is electrically connected to ends of the plurality of even-numbered data lines 6 that are adjacent to the even-numbered gate line 2. In the instant embodiment, the shorting strip 10 is formed on the same layer as the plurality of even-numbered data lines 6 and preferably, the plurality of even-numbered data lines 6 and the shorting strip 10 are formed integrally. Specifically, the plurality of even-numbered data lines 6 and the shorting strip 10 are integrally formed on the same layer (M2 layer) through wire laying technology. Since the plurality of even-numbered data lines 6 is interconnected with each other, it is possible to effectively spread out electrical charges 62 (arrows of FIG. 3 indicating the direction of the movement of the electrical charges) and to prevent an issue of circuit burn-out caused by an excessive current that is induced at the time when the electrical charges 62 are eventually discharged due to accumulation, so as to effectively enhance the yield rate of the liquid crystal display panel.

Preferably, the even-numbered data lines 6 are perpendicularly connected, via a transparent conductive layer 12, to the even-numbered gate line 2 and the odd-numbered data lines 8 are perpendicularly connected to, via the transparent conductive layer 12, to the odd-numbered gate line 4. The transparent conductive layer 12 is made of indium tin oxides.

Figure 4:
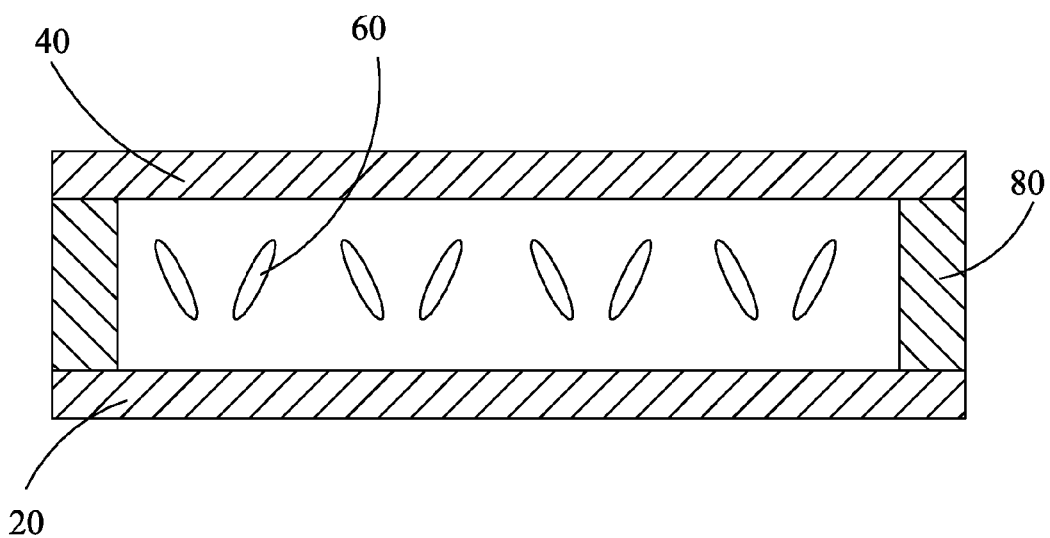
FIG. 4 is a schematic view showing a liquid crystal display panel according to the present invention.
Figure 5:
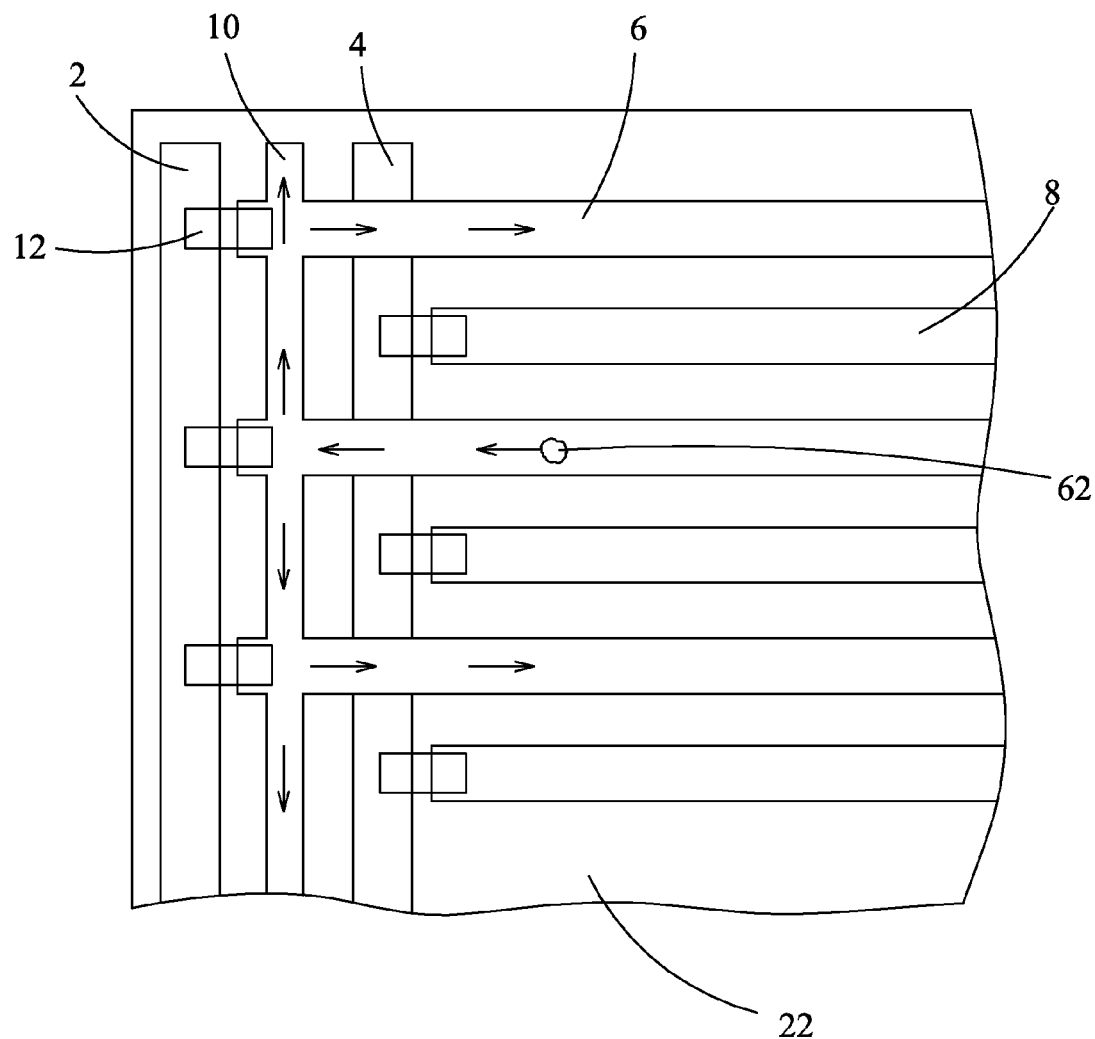
FIG. 5 is a schematic plan view showing a portion of a thin-film transistor substrate according to the present invention.

Referring to FIGS. 4 and 5, the present invention also provides a liquid crystal display panel, which comprises: a thin-film transistor substrate 20, a color filter substrate 40 bonded to the thin-film transistor substrate 20, a liquid crystal layer 60 arranged between the thin-film transistor substrate 20 and the color filter substrate 40, and an enclosure resin frame 80 arranged on a circumferential margin of the color filter substrate 40.

The thin-film transistor substrate 20 comprises a transparent substrate 22, an even-numbered gate line 2 and an odd-numbered gate line 4 formed on the transparent substrate 22, a plurality of even-numbered data lines 6 and a plurality of odd-numbered data lines 8 formed on the transparent substrate 22, and a shorting strip 10 formed on the transparent substrate 22. The even-numbered gate line 2, the odd-numbered gate line 4, and the shorting strip 10 are arranged parallel. The plurality of even-numbered data lines 6 and the plurality of odd-numbered data lines 8 are arranged parallel. The even-numbered data lines 6 are perpendicularly connected to the even-numbered gate line 2. The odd-numbered data lines 8 are perpendicularly connected to the odd-numbered gate line 4. The shorting strip 10 is electrically connected to ends of the plurality of even-numbered data lines 6 that are adjacent to the even-numbered gate line 2. In the instant embodiment, the shorting strip 10 is formed on the same layer as the plurality of even-numbered data lines 6 and preferably, the plurality of even-numbered data lines 6 and the shorting strip 10 are formed integrally. Specifically, the plurality of even-numbered data lines 6 and the shorting strip 10 are integrally formed on the same layer (M2 layer) through wire laying technology. Since the plurality of even-numbered data lines 6 is interconnected with each other via the shorting strip 10, it is possible to effectively spread out electrical charges 62 (arrows of FIG. 3 indicating the direction of the movement of the electrical charges) and to prevent an issue of circuit burn-out caused by an excessive current that is induced at the time when the electrical charges 62 are eventually discharged due to accumulation, so as to effectively enhance the yield rate of the liquid crystal display panel.

Preferably, the even-numbered data lines 6 are perpendicularly connected, via a transparent conductive layer 12, to the even-numbered gate line 2 and the odd-numbered data lines 8 are perpendicularly connected to, via the transparent conductive layer 12, to the odd-numbered gate line 4. The transparent conductive layer 12 is made of indium tin oxides.

Specifically, a manufacture process of the thin-film transistor substrate 20 is that a first metal layer (M1 layer) is first formed on the transparent substrate 22 and then, a masking process is applied to patternize the first metal layer to form a gate (not shown) and the even-numbered gate line 2 and the odd-numbered gate line 4. Afterwards, a gate insulation layer (not shown) is formed on the gate and the even-numbered gate line 2 and the odd-numbered gate line 4 and the gate insulation layer is patternized. Then, an active layer (not shown) is formed on the gate insulation layer. A second metal layer (M2 layer) is formed on the active layer and a masking process is applied to patternize the second metal layer to form source/drain (not shown), the plurality of even-numbered data lines 6, the plurality of odd-numbered data lines 8, and the shorting strip 10. A protective layer (not shown) is formed on the source/drain, the plurality of even-numbered data lines 6, the plurality of odd-numbered data lines 8, and the shorting strip 10 and is patternized. The transparent conductive layer 12 is then formed on the protective layer and the transparent conductive layer is patternized to form a pixel electrode (not shown). Meanwhile, the transparent conductive layer 12 also electrically connects the plurality of even-numbered data lines 6 and the even-numbered gate line 2 and electrically connects the plurality of odd-numbered data lines 8 and the odd-numbered gate line 4.

In summary, the present invention provides a shorting strip structure of a liquid crystal display panel and a liquid crystal display panel, in which the shorting strip connects ends of even-numbered data lines that are adjacent to an even-numbered gate line to each other to effectively spread out electrical charges and to prevent an issue of circuit burn-out caused by an excessive current that is induced at the time when the electrical charges are eventually discharged due to accumulation, so as to effectively enhance the yield rate of the liquid crystal display panel. Further, the shorting strip and the even-numbered data lines are formed simultaneously so that the manufacture process is simple and the cost is low so as to be favorable for cost control.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A shorting strip structure of a liquid crystal display panel, comprising: an even-numbered gate line and an odd-numbered gate line that are arranged parallel, a plurality of even-numbered data lines and a plurality of odd-numbered data lines that are arranged parallel, and a shorting strip that is arranged parallel to the even-numbered gate line, the even-numbered data lines being perpendicularly connected to the even-numbered gate line that is separated from the odd-numbered data lines, the odd-numbered data lines being perpendicularly connected to the odd-numbered gate line that is separated from the even-numbered data lines, the shorting strip being electrically connected to ends of the plurality of even-numbered data lines that are adjacent to the even-numbered gate line and separated from the odd-numbered data lines;

wherein the shorting strip is formed on the same layer as the plurality of even-numbered data lines.

2. The shorting strip structure of a liquid crystal display panel as claimed in claim 1, wherein the even-numbered data lines are perpendicularly connected, via a transparent conductive layer, to the even-numbered gate line and the odd-numbered data lines are perpendicularly connected to, via a transparent conductive layer, to the odd-numbered gate line.

3. The shorting strip structure of a liquid crystal display panel as claimed in claim 2, wherein the transparent conductive layer is made of indium tin oxides.

4. The shorting strip structure of a liquid crystal display panel as claimed in claim 1, wherein the plurality of even-numbered data lines and the shorting strip are formed integrally.

5. A shorting strip structure of a liquid crystal display panel, comprising: an even-numbered gate line and an odd-numbered gate line that are arranged parallel, a plurality of even-numbered data lines and a plurality of odd-numbered data lines that are arranged parallel, and a shorting strip that is arranged parallel to the even-numbered gate line, the even-numbered data lines being perpendicularly connected to the even-numbered gate line that is separated from the odd-numbered data lines, the odd-numbered data lines being perpendicularly connected to the odd-numbered gate line that is separated from the even-numbered data lines, the shorting strip being electrically connected to ends of the plurality of even-numbered data lines that are adjacent to the even-numbered gate line and separated from the odd-numbered data lines;

wherein the even-numbered data lines are perpendicularly connected, via a transparent conductive layer, to the even-numbered gate line and the odd-numbered data lines are perpendicularly connected to, via a transparent conductive layer, to the odd-numbered gate line;

wherein the transparent conductive layer is made of indium tin oxides;

wherein the shorting strip is formed on the same layer as the plurality of even-numbered data lines; and wherein the plurality of even-numbered data lines and the shorting strip are formed integrally.

6. A liquid crystal display panel, comprising: a thin-film transistor substrate, a color filter substrate bonded to the thin-film transistor substrate, and a liquid crystal layer arranged between the thin-film transistor substrate and the color filter substrate, the thin-film transistor substrate comprising a transparent substrate, an even-numbered gate line and an odd-numbered gate line formed on the transparent substrate, a plurality of even-numbered data lines and a plurality of odd-numbered data lines formed on the transparent substrate, and a shorting strip formed on the transparent substrate, the even-numbered gate line, the odd-numbered gate line, and the shorting strip being arranged parallel, the plurality of even-numbered data lines and the plurality of odd-numbered data lines being arranged parallel, the even-numbered data lines being perpendicularly connected to the even-numbered gate line that is separated from the odd-numbered data lines, the odd-numbered data lines being perpendicularly connected to the odd-numbered gate line that is separated from the even-numbered data lines, the shorting strip being electrically connected to ends of the plurality of even-numbered data lines that are adjacent to the even-numbered gate line and separated from the odd-numbered data lines;

wherein the shorting strip is formed on the same layer as the plurality of even-numbered data lines.

7. The liquid crystal display panel as claimed in claim 6, wherein the even-numbered data lines are perpendicularly connected, via a transparent conductive layer, to the even-numbered gate line and the odd-numbered data lines are perpendicularly connected to, via a transparent conductive layer, to the odd-numbered gate line.

8. The liquid crystal display panel as claimed in claim 7, wherein the transparent conductive layer is made of indium tin oxides.

9. The liquid crystal display panel as claimed in claim 6, wherein the plurality of even-numbered data lines and the shorting strip are formed integrally.

* * * * *